United States Patent [19]

Kim

[11] Patent Number: 5,802,001

[45] Date of Patent: Sep. 1, 1998

[54] BURN-IN CHECKING APPARATUS FOR SEMICONDUCTOR MEMORY DEVICE

[75] Inventor: Tae-Hyoung Kim, Kyungki-Do, Rep. of Korea

[73] Assignee: LG Semicon Co., Ltd., Chungcheongbuk-Do, Rep. of Korea

[21] Appl. No.: 905,955

[22] Filed: Aug. 5, 1997

[30] Foreign Application Priority Data

Aug. 6, 1996 [KR] Rep. of Korea ................. 32702/1996

[51] Int. Cl.$^6$ ................................................. G11C 7/00
[52] U.S. Cl. ............... 365/201; 365/230.06; 365/230.08
[58] Field of Search ..................... 365/201, 230.06, 365/230.08, 189.05

[56] References Cited

U.S. PATENT DOCUMENTS 5,640,353  6/1997  Ju ........................................... 365/200
5,654,930  8/1997  Yoo et al. ............................. 365/230.06

*Primary Examiner*—Vu A. Le
*Attorney, Agent, or Firm*—Morgan,Lewis & Bockius LLP

[57] ABSTRACT

An improved burn-in checking apparatus for a semiconductor memory device in which a latch-type decoder is connected between a row address predecoder for decoding an internal or external address when it is inputted and a word line driving unit for driving a word line unit to latch a high level signal for keeping an enabled condition, so that when a burn-in flag is applied, an output from the row address predecoder is decoded again, and a word line selected according to such decoding is continuously enabled even when a next word line is selected in accordance with decoding of a next row address signal. The apparatus has the advantage that by sequentially enabling all the word lines within almost one minute and latching the enabled condition until the completion of the burn-in checking, the actual time consumed in real checking is little increased, and in addition, the contamination of the device characteristic due to an increase in a momentary current amount can be effectively prevented.

4 Claims, 7 Drawing Sheets

INTERNAL OR EXTERNAL ADDRESS

WL0

WL1

WL2

WLn

CONVENTIONAL ART    WLn

FIG. 6A INTERNAL OR EXTERNAL ADDRESS
FIG. 6B WL0
FIG. 6C WL1
FIG. 6D WL2
FIG. 6E WLn
FIG. 6F BURN (LOW)

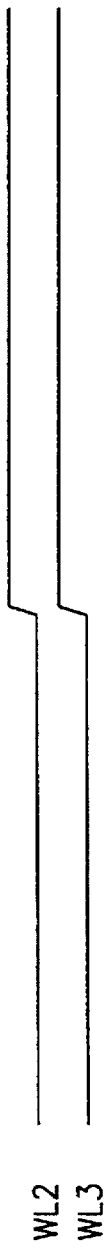
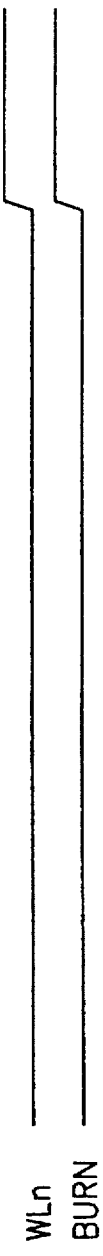
FIG. 7A  INTERNAL OR EXTERNAL ADDRESS
FIG. 7B  WL0 / WL1
FIG. 7C  WL2 / WL3
FIG. 7N  WLn / BURN

BURN-IN CHECKING APPARATUS FOR SEMICONDUCTOR MEMORY DEVICE

This application claims the benefit of application Ser. No. 32702/1996, filed in Korea on Aug. 6, 1996, which is hereby incorporated by reference.

BACKGROUND OF THE INVENTION

1. Field of the Invention

The present invention relates to an apparatus for checking a semiconductor memory device, and more particularly, to a burn-in checking apparatus that is capable of minimizing a momentary current consumed when a word line is enabled for burn-in checking.

2. Discussion of the Related Art

FIG. 1 is a schematic block diagram of a burn-in checking apparatus for a semiconductor memory device according to the conventional art which includes an address buffer 1 for buffering an external address (A), an internal address counter 6 for generating an internal address (HX), and a row address multiplexer 2 for selecting an external address (ACL) outputted from the address buffer 1 or the internal address (HX) outputted from the internal address counter 6. A row address predecoder 3 decodes an address (AX) outputted from the row address multiplexer 2. N decoders 4 receive and decode the output (BAX) from the row address predecoder 3 to drive a plurality of word line driving units 5 individually associated with N word lines. A burn-in flag generator 7 generates a burn-in flag for burn-in checking.

The burn-in flag generator 7 controls the row address predecoder and the n units of decoders 4 so that an address input generated during burn-in checking will not be decoded and used to drive the word line driving units 5. As shown in FIG. 2, during burn-in checking, word lines are sequentially enabled, or as shown in FIG. 3, all word lines are enabled at one time.

FIGS. 2A–2N illustrate timing for completion of burn-in checking for N word lines. This permits stable checking to be achieved. FIGS. 3A–3N illustrate timing for completion of burn in checking when N word lines are all checked at one time by applying a burn-in flag to all the word lines. The time required for burn-in checking can be shortened.

However, in the former case, assuming that 30 minutes are required for burn-in checking of one word line, it will take about 7,680 minutes to check 256 word lines. In the latter case, if all word lines are enabled at one time, the current consumed from an internal voltage supply cannot be evenly distributed resulting in degrading a device characteristics.

SUMMARY OF THE INVENTION

Accordingly, an object of the present invention is a burn-in checking apparatus for a semiconductor memory device which is capable of shortening the burn-in checking time and preventing degradation of device characteristics by minimizing the momentary current.

To achieve the above object, there is provided an improved burn-in checking apparatus for a semiconductor memory device in which a latch-type decoder is connected between a row address predecoder for decoding an internal or external address when it is inputted and a word line driving unit for driving a word line to latch a high level signal for keeping an enabled condition so that when a burn-in flag is applied, an output from the row address predecoder is decoded again, and a word line selected according to the above decoding is continuously enabled even when a next word line is selected in accordance with a next address signal.

BRIEF DESCRIPTION OF THE DRAWINGS

The present invention will become more fully understood from the following detailed description and the accompanying drawings, which are given by way of illustration only and do not limit the scope of the present invention. In the drawings:

FIGS. 6A through 6F are timing waveforms showing the timing of enabling word lines when treating one word line as one unit in a burn-in checking procedure according to the present invention; and FIGS. 7A through 7N are timing waveforms showing the timing of enabling word lines when treating a plurality of word lines as one unit in a burn-in checking procedure according to the present invention.

DETAILED DESCRIPTION OF THE PREFERRED EMBODIMENT

Referring to the accompanying drawings, the present invention will now be described in detail.

Figure 1:
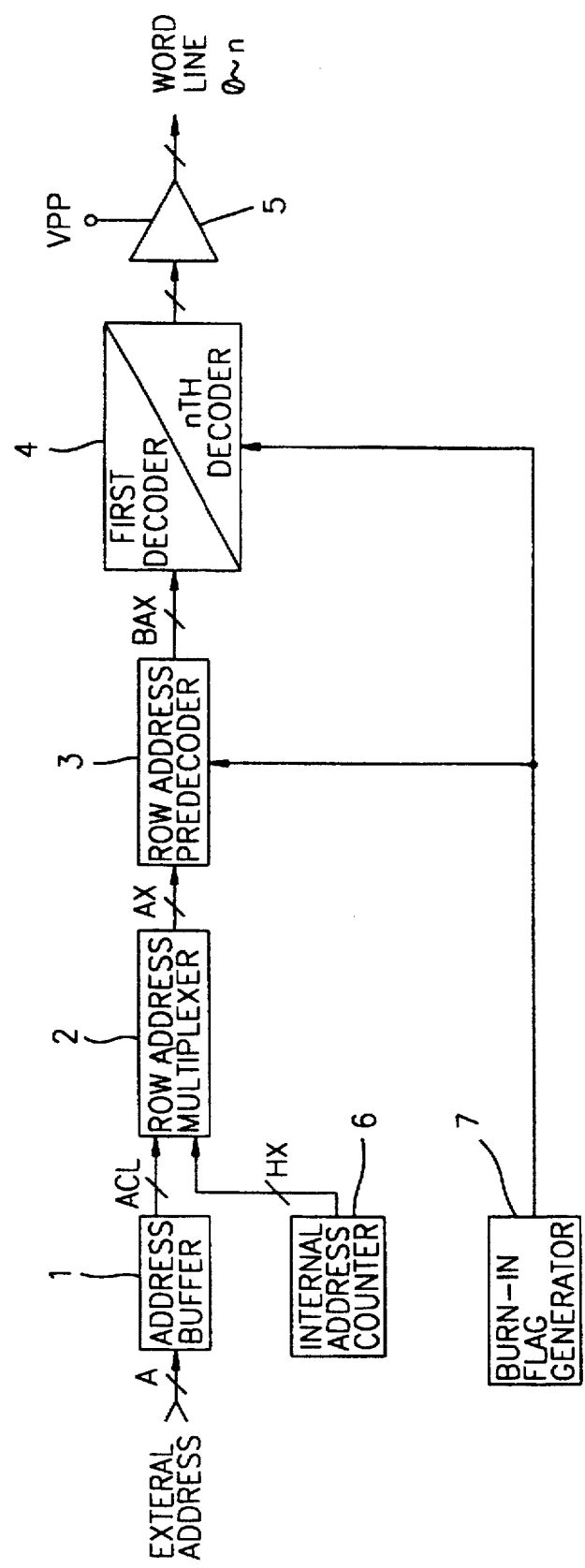
FIG. 1 is a schematic block diagram showing a burn-in checking apparatus for a semiconductor memory device according to the conventional art.
Figures 2A, 2B, 2C, 2D, 2N:
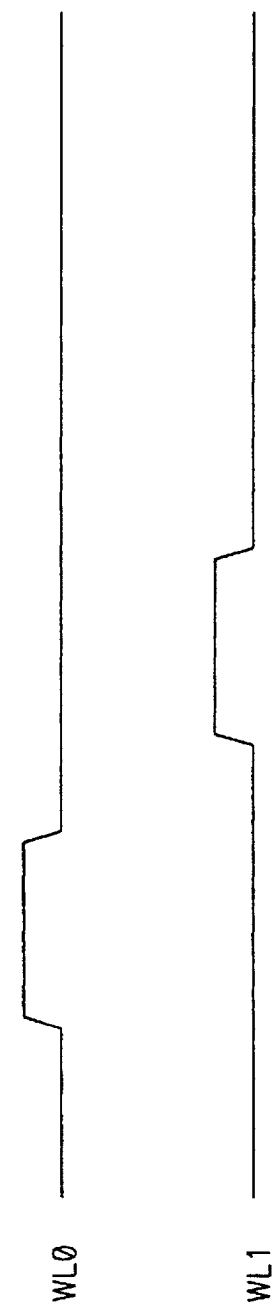
FIGS. 2A through 2N are timing diagrams showing the timing to enable word lines of a semiconductor memory device during burn-in checking according to the conventional art.
Figure 3A:
FIGS. 3A through 3N are timing diagrams showing the timing to enable word lines of a semiconductor memory device during burn-in checking according to the conventional art.
Figure 3B:
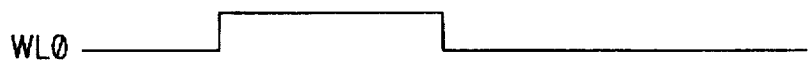
Figure 3C:
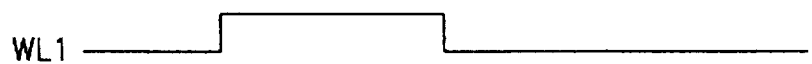
Figure 3D:
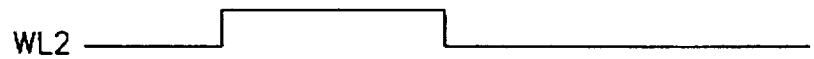
Figure 3N:
Figure 4:
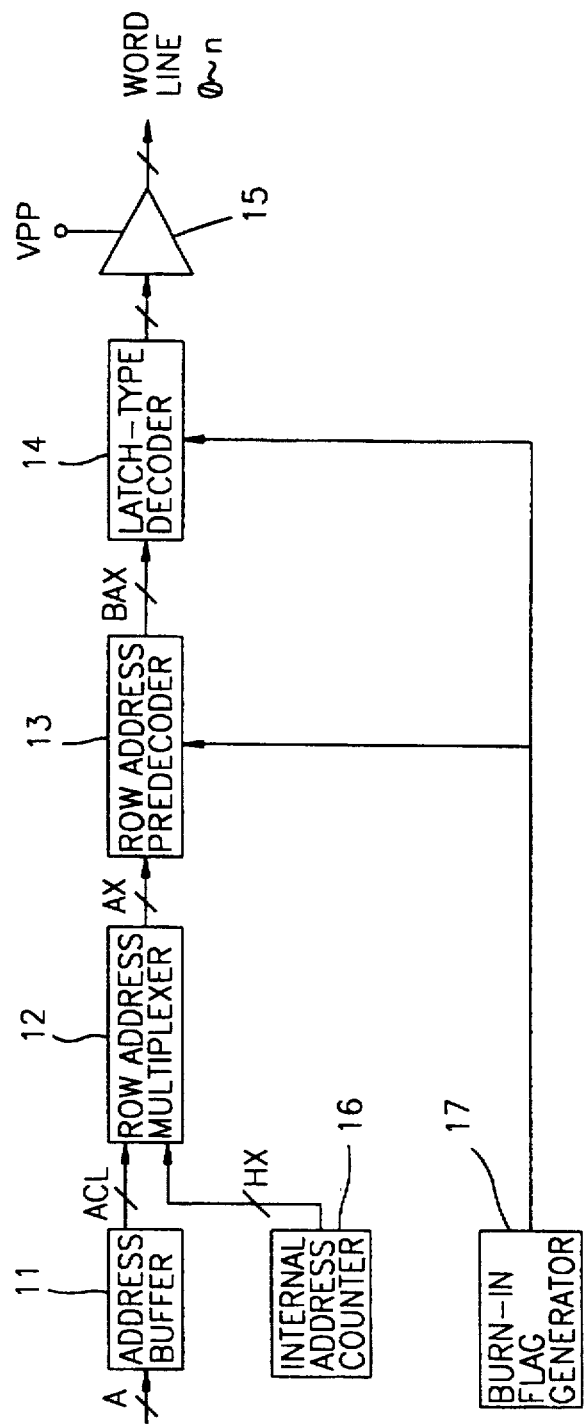
FIG. 4 is a schematic block diagram showing a burn-in checking apparatus for a semiconductor memory device according to the present invention.

As shown in FIG. 4, a burn-in checking apparatus for a semiconductor memory device according to the present invention includes an address buffer 11 for receiving and buffering an externally applied address (A). An internal address counter 16 generates an internal address (HX) and a row address multiplexer 12 selects an externally-applied address (ACL) outputted from the address buffer 11 or the internal address (HX) outputted from the internal address counter 16. A row address predecoder 13 receives and decodes an address (AX) outputted from the row address multiplexer 12. The above-described four elements are connected identically as in the conventional art.

The burn-in checking apparatus according to the present invention further includes a latch-type decoder 14 connected to the row address predecoder 13 for decoding an internal or external address when it is inputted. N word line driving units 15 drive N word lines to latch a high level signal for keeping an enabled condition so that when a burn-in flag is applied from a burn-in flag generator 17, an output from the row address predecoder 13 is decoded again. A word line selected according to the above-described decoding is continuously enabled even when a next word line is selected in accordance with a next address signal. This eliminates the need to use N decoders as in the conventional art.

Figure 5:
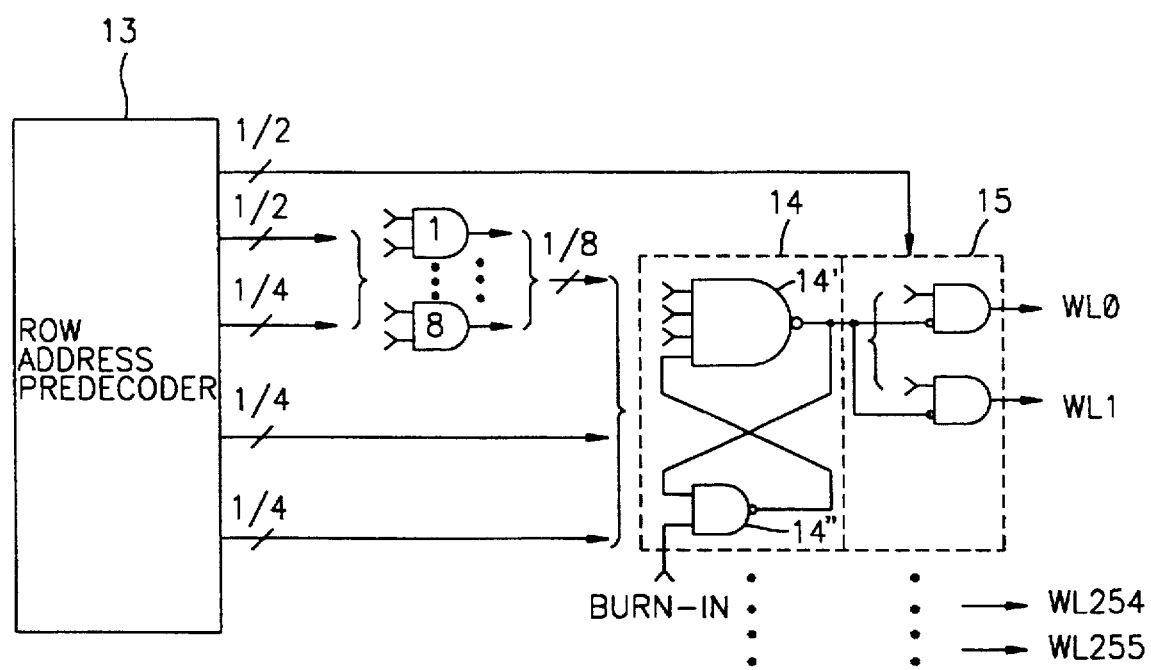
FIG. 5 is a detailed schematic circuit diagram of a latch-type burn-in checking apparatus for a semiconductor memory device according to the present invention.

As shown in FIG. 5, the latch-type decoder 14 includes a NAND gate 14' which receives an output from the row address predecoder 13 and an output from a NAND gate 14" to which a burn-in flag is inputted. The NAND gate 14" receives as inputs the output from the NAND gate 14' and the burn-in flag. As long as the device characteristic is not lowered, a plurality of word lines comprise one word line unit, and are connected to the word line driving units 15 so that they are all enabled simultaneously. As an alternative, each word line comprises one word line unit and is connected to an associated word line driving unit 15.

In the latch-type decoder according to the present invention, when the burn-in flag is a low level, as shown in FIG. 6F, the word lines WL0 to WLn are sequentially enabled and driven in the conventional manner by an internal or external address. However, if two word lines comprise one word line unit, as shown in FIGS. 7A to 7N, when the burn-in flag shown in FIG. 7N is inputted, the two word lines of the unit are simultaneously enabled, and will remain in the enabled condition even though subsequent units of word lines are enabled. Thus, in the preferred embodiment pairs are word lines are sequentially enabled until all word lines have been enabled.

Assuming that it requires one minute for all the word lines to be selected and enabled, the time for burn-in processing will still be significantly shortened when compared with the time during which the cells including each word line are stressed during burn-in checking. However, the momentary current can be minimized constant by preventing all of the word lines from being enabled at one time.

As described above, by sequentially enabling all of the word burn units and, therefore, all of the lines within a short period of time and latching the enabled condition until the completion of the burn-in checking procedure, the total time required to complete burn-in checking is not significantly increased. Moreover, degradation of device characteristics due to an increase in the momentary current amount can be effectively prevented.

Although a preferred embodiment of the present invention has been disclosed for illustrative purposes, those skilled in the art will appreciate that various modifications, additions, and substitutions are possible, without departing from the scope and spirit of the invention as recited in the accompanying claims.

What is claimed is:

1. A burn-in checking apparatus for a semiconductor memory device, comprising:

a row address predecoder for selectively decoding internal and external addresses;

a plurality of word line driving units, each of said word line driving units being connected to a different word line unit to enable the word line unit, wherein each word line unit comprises a plurality of word lines;

a burn-in flag signal generator for providing a burn-in flag signal; and a latch-type decoder for receiving the decoded internal and external addresses and the burn-in flag signal and for sequentially selecting the word line driving units to cause the sequential enabling of the word line units.

2. The apparatus of claim 1, wherein the latch-type decoder includes a gate circuit for simultaneously enabling each of the one word lines included in a word line circuit.

3. The apparatus of claim 1, wherein the gate circuit of the latch-type decoder enables two word lines comprising one word line unit.

4. The apparatus of claim 1, wherein the latch-type decoder comprises a first NAND gate, and a second NAND gate, and wherein the first NAND gate receives an output from the row address predecoder and an output from the second NAND gate and the second NAND gate receives as inputs the burn-in flag and the output from the first NAND gate.

* * * * *